(12) United States Patent
Watson et al.

(10) Patent No.: US 7,796,656 B2
(45) Date of Patent: Sep. 14, 2010

(54) ENHANCED EFFICIENCY LATERALLY-COUPLED DISTRIBUTED FEEDBACK LASER

(75) Inventors: Chris Watson, Ottawa (CA); Kirill Pimenov, Ottawa (CA); Valery Tolstikhin, Ottawa (CA); Greg Letal, Ottawa (CA); Ron Moore, Stittsville (CA)

(73) Assignee: Onechip Photonics Inc., Ottawa, Ontario (CA)

( * ) Notice: Subject to any disclaimer, the term of this patent is extended or adjusted under 35 U.S.C. 154(b) by 238 days.

(21) Appl. No.: 11/979,510

(22) Filed: Nov. 5, 2007

(65) Prior Publication Data
US 2009/0116522 A1    May 7, 2009

(51) Int. Cl.
*H01S 3/098* (2006.01)
*H01S 3/08* (2006.01)
(52) U.S. Cl. .................... 372/19; 372/96; 372/102
(58) Field of Classification Search ............. 372/19, 372/96, 102
See application file for complete search history.

(56) References Cited

U.S. PATENT DOCUMENTS

| | | | |
|---|---|---|---|
| 5,703,977 | A | 12/1997 | Pederson |
| 6,606,443 | B2* | 8/2003 | Sato et al. ............ 385/129 |
| 6,671,306 | B1 | 12/2003 | Forchel et al. |
| 6,714,571 | B2 | 3/2004 | Watanabe et al. |
| 6,795,622 | B2* | 9/2004 | Forrest et al. ............ 385/50 |
| 7,218,814 | B2 | 5/2007 | Vorobeichik et al. |
| 2007/0133648 | A1 | 6/2007 | Matsuda et al. |

OTHER PUBLICATIONS

Wang et al., "155-μm AlGaInAs-InP Laterally Coupled Distributed Feedback Laser", IEEE Photonics Technology Letters, vol. 17, Issue 7, Jul. 2005, pp. 1372-1374.
Sin et al., "Laterally coupled InGaAsP/InP distributed feedback lasers at 1.5 μm for chemical sensing applications", Electronic Letters, 26th Apr. 2001, vol. 37, No. 9, pp. 567-569.
Martin et al., "CW Performance of an InGaAs-GaAs-AlGaAs Laterally-Coupled Distributed Feedback (LC-DFB) Ridge Laser Diode", IEEE Photonics Technology Letters, vol. 7, Issue 3, Mar. 1995, pp. 244-246.
Schreiner et al., "High frequency operation of 1.57 μm laterally gain coupled DFB-Lasers with self aligned ohmic contacts and nickel surface gratings", IEEE 18th International Semiconductor Laser Conference, Sep. 29-Oct. 3, 2002, pp. 21-22.
ISA/CA, "International Search Report" mailed Jul. 4, 2008, pp. 1-4.

\* cited by examiner

*Primary Examiner*—Armando Rodriguez
(74) *Attorney, Agent, or Firm*—Freedman & Associates

(57) ABSTRACT

The invention describes the method and apparatus for enhanced efficiency in a laterally-coupled distributed feedback (LC-DFB) laser. In a device featuring the effective ridge design, lateral confinement of the guided optical modes is provided by a surface etched grating, which also serves as a DFB element of the laser. Coupling and quantum efficiency of such a LC-DFB laser both improve with an increase of the lateral mode order. In accordance with this invention, a dramatic enhancement of the laser efficiency is achievable by designing it to operate in one of the higher order modes, notably the first order mode, while all the other lateral modes, including the zero order mode, are suppressed through gain-loss discrimination. In the exemplary embodiment of the invention, this enhanced efficiency technique is applied to the design of a single-mode LC-DFB laser suitable for a monolithic integration with other active and passive functional elements of photonic integrated circuits fabricated by using one-step epitaxial growth.

17 Claims, 7 Drawing Sheets

ENHANCED EFFICIENCY LATERALLY-COUPLED DISTRIBUTED FEEDBACK LASER

FIELD OF THE INVENTION

The invention relates generally to the field of semiconductor optoelectronic devices, and more particularly to the design of the distributed-feedback lasers for use in photonic integrated circuits (PICs).

BACKGROUND OF THE INVENTION

The explosive growth of the optical communication traffic in recent years, driven by bandwidth hungry applications and progress in transmission technologies alike, has greatly contributed to ever-increasing demand for higher capacity optical networks offering more flexibility at lower cost. Two different yet complimentary trends are becoming more and more evident in this respect. First, deep penetration of the optical fiber into the access networks and, second, greater demand for capacity, bandwidth provisioning and agility back up into the upper layer networks. Both require massive deployment of the optical gear that drives the traffic along the fiber links, on a scale not seen in earlier generation networks. Specifically, optical transceivers, which receive downstream and send upstream data signals, have to be deployed at every optical line terminal or/and network user interface in the access optical networks, but they also are the key optical components to be installed at every node of opaque (local or metropolitan area) optical networks. Whereas performance requirements, e.g. in terms of speed, optical power or sensitivity, for such optical components may be relaxed as compared to their upper layer networks counterparts, cost efficiency and volume scalability in manufacturing are increasingly becoming the major requirements for their mass production.

Photonic integrated circuits (PICs), in which multiple elements of common or different functionalities are monolithically integrated onto one chip, are an attractive solution to mass production of highly functional optical components in that they enable scalable volume manufacturing by means of semiconductor wafer fabrication techniques. As such PICs offer the ability to dramatically reduce the component footprint, avoid multiple packaging issues, eliminate multiple optical alignments and, eventually, create economical conditions in which optical components achieve the cost efficiency and volume scalability enabling to transfer them into consumer photonics products. The advantages of PIC technology become especially compelling when active waveguide devices, such as laser or photodetector, are combined with the passive waveguide circuitry to form a highly functional photonic system on the chip. Since the active devices usually all are made from artificially grown semiconductors having bandgap structure adjusted to the function and wavelength range of their particular application, such semiconductors are the natural choice for the base material of the PICs. For example, indium phosphide (InP) and related III-V semiconductors are the common material system for the PICs used in optical fiber communications, since they uniquely allow the active and passive devices operating in the most important wavelength windows around 1555 nm and 1310 nm to be combined onto the same InP substrate.

The deeper penetration of optical fiber into the access networks has arisen as optical technologies offer significant advantages in both reach and bit rate over copper-based alternatives and can sustain the projected user driven consumption of bandwidth intensive applications. Optical technologies are therefore expected to dominate in future broadband access networks, and amongst the variety of optical access network architectures under consideration and development, the passive optical network (PON) appears to be the most appealing in terms of cost-effectiveness, bandwidth provisioning, and scalability. In PON networks such as fiber-to-the home (FTTH), fiber-to-the-curb (FTTC), and fiber-to-the-node (FTTN) networks, optical transceivers form the key element of the optical network terminals (ONTs) that terminate either every subscriber node as in FTTH, or small numbers of subscribers as evident in commercial deployments of FTTN within North America. Accordingly, millions of optical transceivers will be needed to complete future FTTH deployments.

The optical transceivers in such ONTs are the interface between the electrical and optical domains and are bi-directional devices that use different wavelengths to transmit and receive signals between the central office (CO) and the ONTs. Owing to the cost sensitive nature of FTTH/FTTN deployments, the directly modulated semiconductor laser is used exclusively as the transmitter technology; and as link specifications become more exacting, the use of single mode distributed feedback (DFB) lasers becomes increasingly important.

Presently, FTTH/FTTN transceivers are built from discrete optoelectronic components that are co-packaged, and it is unlikely that this approach will achieve the cost point, even in volume manufacture, that is required for massive FTTH deployment. To overcome the limitations of hybrid integration, photonic integrated circuits (PICs), in which multiple elements of common or different functionalities are monolithically integrated onto one chip, have been proposed as an attractive solution to mass production: PICs offer the ability to dramatically reduce the component footprint, avoid multiple packaging issues, and eliminate multiple optical alignments. Whilst many aspects of the invention will be described by reference to FTTH/FTTN applications the invention is applicable to distributed feedback lasers designed for other optical telecommunications networks and applications.

In the context of optical networks, PICs are generally designed to operate in the most important wavelength windows about 1555 nm and 1310 nm and in this respect, indium phosphide (InP) and related III-V semiconductors for a suitable material system as these compounds allow for the integration of both active and passive devices operating at these wavelengths. It is also important for the development of PICs destined for such low cost applications as FTTH that the fabrication and manufacturing processes should be ones of low complexity and high yield. This requirement is particularly difficult to meet when a conventional DFB laser is integrated onto the PIC because of the need, within the prior art, for at least one crystalline material re-growth during the fabrication process.

A conventional DFB laser incorporates a periodic perturbation of the propagation medium which causes wavelength selective coupling between the waves propagating bi-directionally along the grating axis by the principle of Bragg reflection. This grating is usually formed by an etched corrugation in a layer that is close to the waveguide core as this leads to strong coupling and favorable laser characteristics. Unfortunately, however, the epitaxial growth that is needed to bury the etched corrugation is very demanding in respect to the quality of the interface between the etched surface and the over-grown epitaxial material. As a consequence, the conventional method of DFB fabrication is neither low complexity nor high yield and therefore not suitable for PICs used in low cost applications.

An alternative approach to DFB laser grating fabrication, which eliminates the low-yield epitaxial re-growth processes, and therefore much more appropriate to PICs, is the so-called laterally coupled (LC) optical grating. In this technique, a grating is formed on either side of the laser ridge waveguide by surface etching semiconductor materials or by selectively depositing metal. Of these two options, the most elegant solution from the perspectives of fabrication simplicity and performance for the LC grating design is referred to within the prior art as an effective-ridge laterally coupled surface etched grating (LC-SEG). Within the LC-SEG the lateral optical confinement of the ridge waveguide used for the laser is provided by and combined with the optical Bragg grating, being formed thereby from two sets of narrow trenches etched from the top surface of the ridge, along the propagation direction and at a fixed distance from one to the other.

The first experimental demonstration of a DFB laser using LC-SEG was reported by L. M. Miller et al, "A Distributed Feedback Ridge Waveguide Quantum Well Heterostructure Laser" [Technology Lett., Vol. 3, No 1, PP. 6-8, 1991]. Here, direct write electron beam lithography and reactive ion etching (RIE) were used to fabricate third- and fifth-order gratings in the InGaAs—GaAs—AlGaAs material system to demonstrate lasing at 1.05 μm. Subsequently, the effective-ridge LC-SEG was extended to DFB lasers at longer wavelengths in other material systems, for example, in GaInAsP—InP, see for example H. Abe et al, "1.55 μm Surface Grating Strained MQW-DFB Laser" [Ext. Abstr., 58$^{th}$ Annual Meet. Jpn. Soc. Applied Physics, P. 1111, 1997]; Y. Watanabe et al, "Laterally Coupled Strained MQW Ridge. Waveguide Distributed-Feedback Laser Diode Fabricated by Wet-Dry Hybrid Etching Process" [IEEE Photon. Technology Lett., Vol. 10, No. 12, pp. 1688-1690, 1998] and Watanabe et al [U.S. Pat. No. 6,714,571]. The approach also being extended to AlGaInAs—InP material systems, see for example J. Wang et al, "1.55-μm AlGaInAs—InP Laterally Coupled Distributed Feedback Laser" [IEEE Photon. Technology Lett., No. 7, pp. 1372-1374, 2005].

In another example of the previous art, a first order surface grating of chromium, rather than etched semiconductor materials, was deposited by electron beam lithography. See Schreiner et al, "Laterally gain-coupled 1.57 um DFB lasers with chromium surface grating and self-aligned Ti/Pt/Au ohmic contact" [Electron. Lett., 36, PP 636-637, 2000].

Although it is evident from such prior art that LC gratings, and in particular LC-SEG structures, can be integrated with single growth PICs, a major disadvantage of this type of grating in relation to LC-DFB lasers is that the propagating optical mode only interacts with the surface grating through its evanescent field; and so the coupling is much weaker than can be achieved with a buried grating. As a result LC-DFB lasers must have a longer cavity to compensate for the lower coupling; and in direct modulation applications, this is an issue because of the parasitic capacitance of laser, which limits the bandwidth, will therefore is reduced through the increased length of the LC-SEG based LC-DFB lasers.

Accordingly, prior art approaches have sought to maximize the coupling coefficient in LC-DFB laser designs by using low order gratings which require slow and expensive processes such as direct write electron beam lithography that are not suited to low cost PICs. While other prior art, such as Reid et al, "Narrow Linewidth and High Power Distributed Feedback Lasers Fabricated without a Regrowth Step" [Proceed. of European Conference on Optical Communications 2003 (ECOC 2003), Rimini, 2003] describe the fabrication of a LC-SEG DFB laser using processes that are very desirable for low cost PICs, namely commercial optical stepper lithography and inductively coupled plasma (ICP) etching systems; the laser described therein being designed for a high power application where a low coupling coefficient and long laser cavity were acceptable.

It would be advantageous therefore to provide a solution removing the constraints of the prior art, by offering increased design, fabrication and utilization opportunities for the approach within integrated photonics components, namely PICs. It would be further advantageous if the solution was compatible to standard semiconductor materials, exploited an epitaxial semiconductor structure growth approach using a single growth step, and supported a plurality of active waveguides, each active waveguide for operating upon different operating wavelengths with bandwidth commensurate to the application.

OBJECT OF THE INVENTION

The object of the invention is for enhanced efficiency in a laterally-coupled distributed feedback (LC-DFB) laser. In a device featuring the effective ridge design, lateral confinement of the guided optical modes is provided by a surface etched grating, or other lateral grating, which also serves as a DFB element of the laser. Coupling and quantum efficiency of such a LC-DFB laser both improve with an increase of the lateral mode order. In accordance with this invention, a dramatic enhancement of the laser efficiency is achieved by designing it to operate in one of the higher order modes, notably the first order mode, while all the other lateral modes, including the zero order mode, are suppressed through gain-loss discrimination. In the exemplary embodiment of the invention, this enhanced efficiency technique is applied to the design of a single-mode LC-DFB laser suitable for a monolithic integration with other active and passive functional elements of photonic integrated circuits fabricated by using one-step epitaxial growth.

SUMMARY OF THE INVENTION

In accordance with an embodiment of the invention, there is provided a semiconductor substrate, an epitaxial semiconductor structure grown on this substrate in one growth step, to form a laser layer. The said laser consists of a lightly or unintentionally doped separate confinement heterostructure (SCH), including an active region having an effective bandgap energy adjusted to the laser's operating wavelength range and sandwiched between heavily doped cladding/contact layers so forming a p-i-n junction. The composition and thickness of the epitaxial layers are selected such that the resulting slab waveguide supports only one guided optical mode in any wavelength within the predetermined operating wavelength range. The operational basis of this embodiment is defined by the following characteristics:

A mesa is defined by etching an enclosed area from the top surface, through the active region, into the lower contact layer therein, two periodic sequences of parallel segmented trenches which extend to the edge of the mesa are defined by direct writing e-beam or optical stepper lithography or any other suitable method and etched from the top surface of the structure into the upper SCH layer such that a central strip of intact material is formed between the trenches, hereafter referred to as the central effective ridge;

therein, the optical waveguide formed by the mesa and effective ridge can support at least two lateral modes whose electric field is polarized parallel to the growth plane and perpendicular to the central effective ridge;

therein, the waveguide mode with the highest effective propagation index whose intensity profile is symmetric about an axis which is perpendicular to the growth plane and which passes through the center of the effective ridge, is known as the zero order mode; and the waveguide mode with odd symmetry is known as the first order mode;

therein, the zero order mode and first order mode interact with the WBG formed by the trenches such that the efficiency of the interaction is characterized, for each mode separately, by the coupling coefficient which is proportional to the overlap between the optical mode and the grating region with the coupling coefficient being larger for the first order mode than the zero order mode;

such that when the injection current is above the laser threshold condition, the zero order mode is suppressed by loss/gain/feedback discrimination so that the laser emits in only the first order lateral mode and at a wavelength which is determined by the WBG.

Whilst described in the above embodiment is a design featuring an LC-SEG with a single effective ridge, optionally the invention may also use other configurations of lateral WBG which replace the two periodic trench segments with variety of elements including, but not limited to, either (i) an LC-SEG in which four or more periodic sequences of parallel segmented trenches are formed by etching from the top surface of the structure into the upper SCH layer such that the intact material formed between the trenches forms a plurality of side ridges in addition to a central effective ridge, hereafter referred to as a multiple effective ridge design; or (ii) a periodic sequence of identical metal strips which are selectively deposited on either side of a central effective ridge on the etched surface between the base of the central effective ridge and the edge of the mesa, hereafter referred to as metal grating design.

In a first embodiment of the invention, the laser structure is grown on a semi insulating substrate and two periodic sequences of parallel segmented trenches which extend to the edge of the mesa are defined by direct writing electron beam or optical stepper lithography or any other suitable method and etched from the top surface of the structure into the upper SCH layer to form a central effective ridge. Subsequently metal contacts are formed atop the central waveguide ridge, which is p doped, and atop the exposed heavily n doped lower contact layer, which surrounds the mesa. This electrode arrangement is hereafter known as a side contact design and is an important electrode geometry for DFB LC-SEG lasers used for PICs in III-V semiconductor such as InP and related compounds.

In a second embodiment of the invention the LC-SEG of the first embodiment is replace by a multiple effective ridge design.

In a third embodiment of the invention the LC-SEG of the first embodiment is replace by a metal grating design.

In fourth embodiment of the invention, the laser described in the first embodiment is combined with an additional element, hereafter referred to as a first order mode to zero order mode converter, which transforms the first order lateral mode emitted by the laser into a waveguide mode with a symmetry that is compatible with telecommunications grade single mode optical fiber, such as Corning® SMF-28 singlemode fibre for 1310 nm and 1550 m operation. In the preferred implementation of the first order mode to zero order mode converter, a second passive semiconductor waveguide, having a larger bandgap than that of the laser, is included between the substrate and laser structure, and is etched to form a secondary mesa such that the resulting optical circuit achieves the required first order mode to zero order mode transformation. It would also be evident to one skilled in the art that the transformation of first mode laser field profile could also be achieved by conventional bulk/fibre optic components as opposed to a monolithically integrated first order mode to zero order mode converter. Optionally, additional embodiments may be considered by replacing the laser element of the forth embodiment with a structure according to either the second or third embodiment.

In a fifth embodiment of the invention, the two periodic sequences of parallel segmented trenches on either side of the effective ridge, according to the first embodiment are implemented with two slightly different periods thereby realizing a two-wavelength DFB laser. The coupling enhancement of the present invention is essential for practical implementation of this embodiment, due to effective halving of coupling efficiency of each WBG. Optionally, additional embodiments may also be considered by replacing the laser element of the fifth embodiment with a structure according to either the second or the third embodiment, and implementing two slightly different periods for the periodic features on either side of the central effective ridge. Optionally, additional embodiments may also be considered by including a first order mode to zero order mode converter.

In a sixth embodiment of the invention, the coupling-enhanced LC-SEG waveguide structure design is applied to a semiconductor distributed Bragg reflector (DBR) laser. The device has the layer structure similar to that described above for the DFB laser but differs in the mechanism of the optical feedback. This is provided by wavelength-selective DBR mirrors which are positioned on both sides of a gain region which is constructed according to the third embodiment but omits the selectively deposited metal strips. The DBR mirrors are constructed according to the first embodiment but the width of the central effective ridge in this region is adjusted to ensure an optical impedance match between the mirror and gain section. Optionally, additional embodiments may be considered by replacing the DBR mirrors of the sixth embodiment with structures according to either the second or third embodiment. Optionally, additional embodiments may also be considered by including a first order mode to zero order mode converter. It will also be apparent to one skilled in the art, that the DBR mirror function can be implemented as an first order mode lateral grating in a passive waveguide layer that may operate separately from, or as part of, a monolithically integrated laser structure.

Other embodiments may also be considered by applying the first order mode LC-SEG laser design to laser structures which are grown on doped substrates with a contact applied to the bottom of the substrate, hereafter known as a bottom contact design. It will also be apparent that doping of the lower cladding-active region-upper cladding structure may be either p-i-n or n-i-p.

DETAILED DESCRIPTION OF EMBODIMENTS OF THE INVENTION

Figure 1:
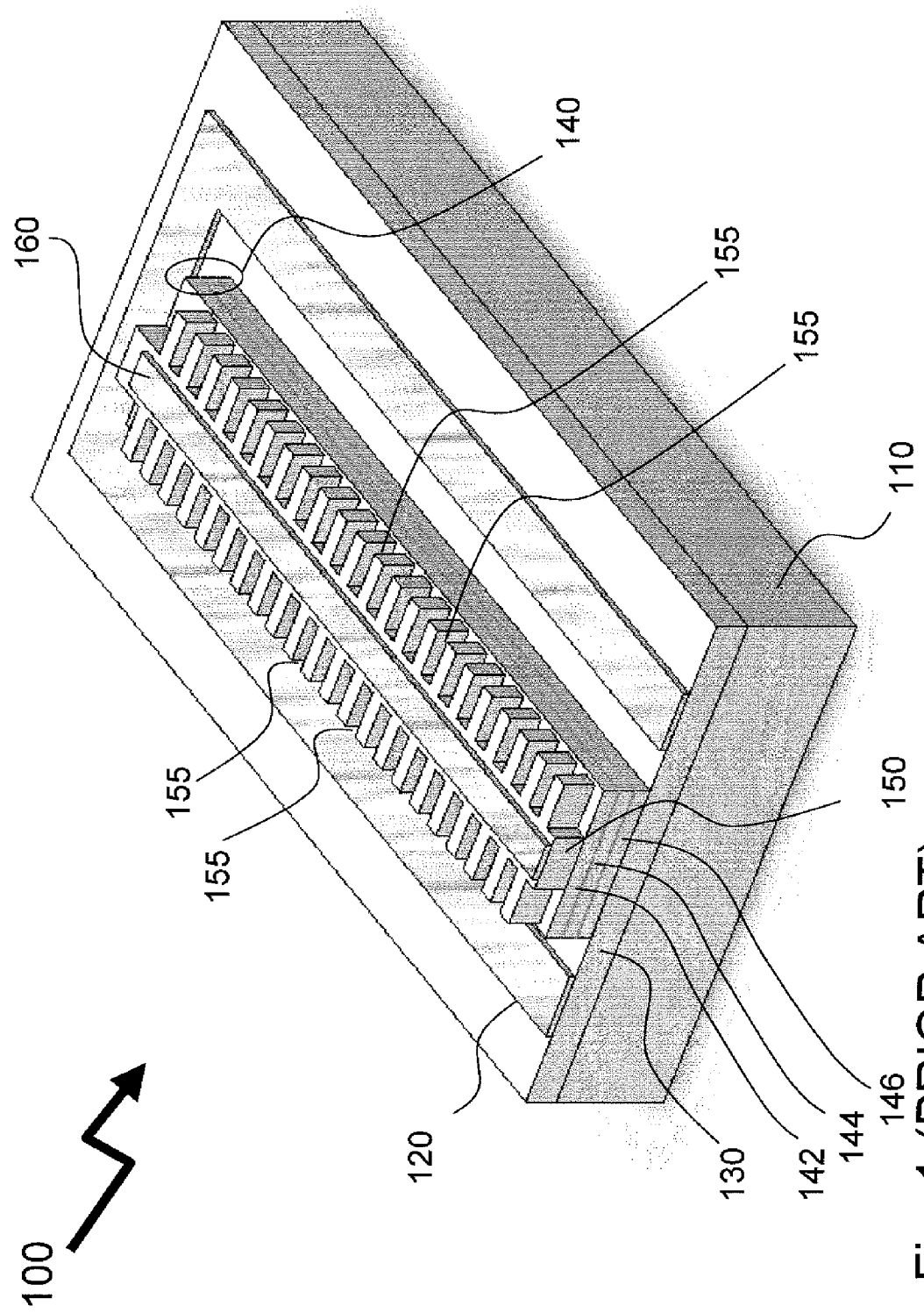
FIG. 1 presents a schematic three-dimensional view of a prior art embodiment of a side contact effective ridge LC-SEG DFB laser structure using periodic continuous trenches to form the WBG which is formed on an etched mesa.

Shown in FIG. 1 is a schematic three-dimensional view of a prior art embodiment of a side-contact LC-SEG DFB laser 100. The side-contact LC-SEG DFB laser 100 comprising a laser layer structure comprising: a semi-insulating substrate 110; a lower contact layer 130; a lower SCH 146; an active layer 144; an upper SCH layer 142; and an upper contact layer 150. The LC-SEG is located on top of the mesa region which is defined by etching from the top surface into the lower contact layer. The LC-SEG waveguide structure is defined by a periodic sequence of continuous trenches 155 which are etched into the top portion of the upper contact layer on either side of narrow strip of intact material which defines the effective ridge. The combination of the mesa; effective ridge; and LC-SEG provide lateral confinement for the slab waveguide which is formed by laser layer structure. The lateral confinement of the LC-SEG is caused by the difference in refractive indices between the intact and etched portions of the grating, $n_I$ and $n_E$ respectively. The trenches also cause a periodic perturbation of the effective-ridge waveguide, which results in Bragg reflection and bi-directional coupling, of the guided modes that propagate perpendicular to the direction of the trenches 155. Consequently, when this wavelength dependent feedback is combined with the optical amplification that is generated when sufficient carriers are injected into the active layer 144 from metal contact pads located along the top effective ridge on the upper contact layer 160 and at the side of the mesa in the lower contact layer 120, a laser oscillation results.

As is well known from previous art, coupled mode theory can be used to describe the propagation of electromagnetic waves in periodic structures such as DFB lasers (e.g. see G. P. Agrawal and N. K. Dutta, "Long wavelength Semiconductor Lasers", N. Y. Van Nostrand, 1968). Accordingly, an important parameter in DFB laser design, that is described by this theory, is the coupling coefficient, κ, which can be estimated for an LC-SEG as:

$$\kappa = \frac{(n_I^2 - n_E^2)}{\lambda n_{eff}} \frac{\sin(m\pi\varepsilon_E)}{m} \Gamma \quad (1)$$

where m is the grating order, $\varepsilon_E$ is the etching duty cycle in the periodic trench structure, i.e. the fraction of the grating period occupied by the trench; Γ is the overlap integral between the mode's field and the grating, $n_{eff}$ is the effective index of the waveguide mode, and λ is the emission wavelength of the laser.

For DFB lasers intended for direct modulation applications, κ, should be large in order to minimize the laser cavity length, L, and the associated parasitic capacitance. In this respect, equation (1), suggests that a large index contrast between the etched and intact portion of the upper cladding is of benefit. Unfortunately, however, in LC-SEG waveguide structures, an increase in index contrast generally degrades the overlap because of the associated reduction in the effective material index of the grating region, $n_G$, which is given by, $$n_G = \sqrt{\varepsilon_E n_E^2 - (1-\varepsilon_E) n_I^2} \quad (2)$$

Typically, in III-V semiconductor materials, the refractive index of the epitaxial layers, and therefore, $n_I$, is well above 3, whereas the index of the etched portion, $n_E$, does not exceed 2. Thus, for any reasonable duty cycle, $n_G \ll n_{eff}$, with the result that the evanescent optical field decays significantly as it penetrates the grating region leading to a poor overlap between the field and the LC-SEG. This poor overlap leads to low coupling which, as noted above, must be offset by increasing the laser length in order to achieve 1.5<κL<2.5 which is typical in direct modulation applications. The prior art, therefore, has sought to increase, Γ, of the zero order lateral mode by modifying the geometry of the LC-SEG; and this objective has been restricted by the requirement to avoid multimode operation which would lead to undesirable transmitter characteristics such as kinks in the light-injection current laser characteristic and increased optical noise.

An alternative approach which overcomes the limitations of the previous art, and is the subject of this invention, is to design the laser to oscillate in the first order mode rather than the zero order mode. This arrangement benefits from the reduced confinement of the first order mode to increase the coupling coefficient that could be obtained from a design using the zero order mode. This benefit is emphasized in FIGS. 2A and 2B, which show the increasing field penetration of an LC-SEG design with lateral mode order. Referring to plan view 200 in FIG. 2A shown is the central ridge 210 of a LC-SEG DFB laser, together with unetched regions 220 and etched trenches 230. Accordingly for the width w, as shown in modal solution plot 250, the resulting optical waveguide supports three optical modes, the zero order mode 260, also referred to a fundamental mode, first order mode 280 and second order mode 270. It is also important to note that in the context of PICs, the asymmetric field profile of a first order mode 280 of the LC-SEG DFB laser, shown in FIG. 2A by plan view 200, is not a disadvantage as this field profile is not directly coupled to single mode fibre. As can be seen from FIG. 2B for each of the modes in the modal solution plot 250 there is a portion of the optical mode field that extends beyond the edge E-E of the central ridge 210, the proportion of this mode increasing with increasing mode order.

An important restriction on the operation of a first order mode LC-SEG DFB laser, which is shared with prior art designs, is that the laser be single mode so as to avoid the impairments of a multimode transmitter. Consequently, the design of a first order mode LC SEG DFB laser involves engineering sufficient threshold gain margin between the first order and zero order modes such that the laser only oscillates in the first order mode. Accordingly, for the first order mode, the design process entails, maximizing both the coupling and modal gain while minimizing the modal loss; whereas for the zero order mode, both the coupling and modal gain should minimized while the modal loss is maximized.

In this respect, the configuration of the side-contact LC-SEG DFB laser offers several opportunities to achieve the gain margin that is required for stable, single mode operation in the first lateral mode. First, the larger coupling coefficient of first order mode ensures that the optical feedback for the first mode is larger than that for zero mode with the result that less optical gain is needed to attain threshold. Second, optical loss discrimination can be introduced by exploiting the field profiles of the first and zero order modes to ensure that the zero order mode experiences greater propagation loss than first order mode. In a side-contact LC-SEG DFB this objective is readily achieved by reducing the thickness of the upper cladding so that the zero order mode experiences significant optical loss as a result of absorption in the top contact metal. In this case, the loss of first mode will be relatively unaffected owing to the lower field overlap of this mode with the metal region. An additional advantage of this arrangement over the prior art designs, is that a thinner upper contact results in a more favorable etch aspect ratio for the trenches that form LC-SEG. Third, the gain margin can be increased by ensuring that the first order mode has greater overlap with the gain distribution in the active region than does zero order mode. This objective readily achieved in side contact designs in which the upper contact is n doped and lower contact is p doped.

To further illustrate the advantage of a first order mode LC-SEG DFB, numerical calculations are conducted on an exemplary design and described below.

Figure 3:
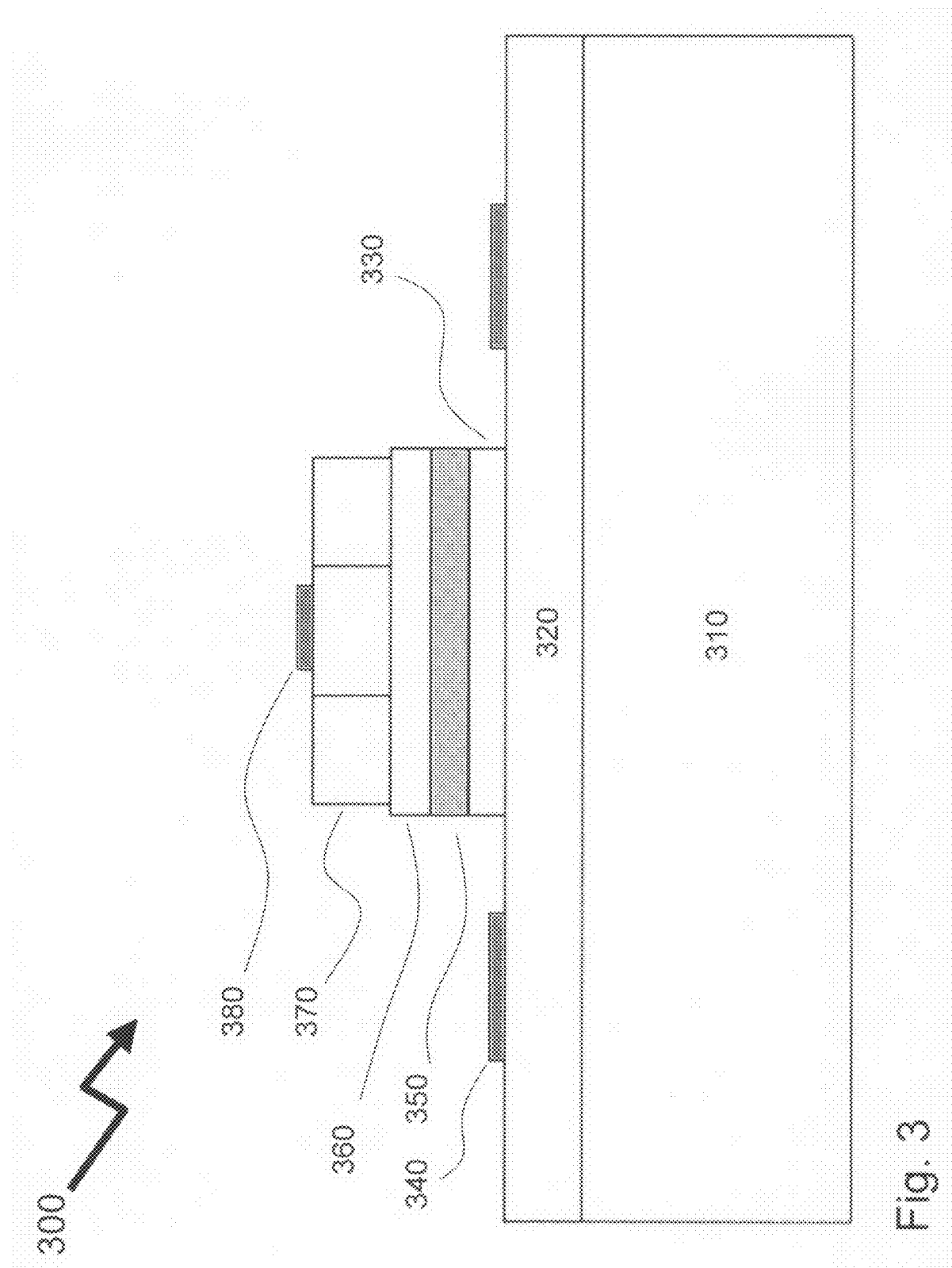
FIG. 3 presents a cross section of an LC-SEG DFB structure related to the first embodiment.

FIG. 3 shows the cross sectional view of a side contact LC-SEG DFB laser according to the first embodiment. The GaInAsP—InP laser layer structure, which is tabulated in Table 1, is adapted from a design described by J. Piprek et al, "Cavity Length Effects on Internal Loss and Quantum Efficiency of Multiquantum-Well Lasers", IEEE J SEL TOP QUANT., 5, PP. 643-647, 1999.

As is shown in table 1, the laser structure consists of an MQW active region surrounded by an upper and lower SCH layers all of which are unintentionally doped. The active region comprises 6 compressive strain wells of 5.5 nm laminated between 5 barriers of 6.4 nm which, when appropriately pumped, induces gain for TE polarized light near 1550 nm. In this exemplary structure, the lower contact is n doped while the upper contact, which consists of InP capped by a thin layer InGaAs, is p doped.

The dimension of the ridge, mesa, and thickness of the upper contact layer, shown in FIG. 3, were selected to achieve the following objects:
  i) cut off all lateral modes above first order;
  ii) minimize the threshold gain of the first order mode; and
  iii) maximize the threshold gain of the zero order mode.

Note that these calculations assume $n_G=2.65$, which was computed according to equation (2) assuming a 50% duty cycle and $n_E=2.0$ (within the material index range of materials such as Silicon Nitride).

The mode profile of both the zero order and first order modes were determined numerically using commercially available tools and are reproduced in FIGS. 4A and 4B as contours of constant optical field strength maps 410 and 420 respectively. These profiles clearly show that first mode, 420, is less confined than zero mode, 410, and as consequence the first mode has a greater overlap with grating region, 430. The superior characteristics of the first order mode for LC-SEG design are illustrated in Table 2 which displays:
  i) the coupling coefficient which was computed according to equation (1) assuming a $5^{th}$ order rectangular grating;
  ii) the propagation loss due to absorption in the InGaAs cap and p contact metal;
  iii) the threshold gain that is required for a 250 um laser.

TABLE 2

LC-SEG DFB LASER CHARACTERISTICS FOR FIFTH ORDER RECTANGULAR GRATING

| Lateral Mode Order | Coupling Coefficient (1/cm) | Propagation Loss (1/cm) | Threshold Gain for 250 um cavity (1/cm) |
| --- | --- | --- | --- |
| Zero | 28 | 1.30 | 179 |
| First | 86 | 0.15 | 74 |

The data in table 2 clearly show the advantage of a first order mode laser over a zero order design. As a result of the

TABLE 1

EXEMPLARY LAYER STRUCTURE USED IN SIMULATIONS

| Layer | Material | Refractive Index | Thickness (μm) |
| --- | --- | --- | --- |
| 1. P-Cap | InGaAs (P-doping $10^{19}$ cm$^{-3}$) | 3.512 + i 0.14 | 0.15 |
| 2. Upper-Contact | InP (P-doping $10^{18}$ cm$^{-3}$) | 3.166 + i 3.1 10$^{-4}$ | 0.85 |
| 3. Upper SCH | GaInAsP ($\lambda_g$ = 1150 nm) | 3.322 | 0.1 |
| 4. Active MQW | GaInAsP ($\lambda_g$ = 1250 nm) | 3.444 | 0.017 |
|  | 6 Wells: Ga$_{0.76}$In$_{0.24}$As$_{0.79}$P$_{0.21}$ (1% compressive strain) |  | 6 × 0.0055 |
|  | 5 Barriers: GaInAsP ($\lambda_g$ = 1250 nm) |  | 5 × 0.0064 |
|  | GaInAsP ($\lambda_g$ = 1250 nm) |  | 0.017 |
| 5. Lower SCH | GaInAsP ($\lambda_g$ = 1150 nm) | 3.322 | 0.2 |
| 6. Lower-Contact | InP (N-doping 5 × $10^{18}$ cm$^{-3}$) | 3.139 | 0.5 |
| 7. InP Buffer | InP | 3.169 | 0.5 |
| 8. Substrate | InP | 3.169 | N/A | larger coupling and lower loss of first order mode, the threshold gain for this mode is significantly lower than that of the zero mode with result that when the laser is operated above threshold it will emit in only a single, namely the first, lateral mode.

Whilst the structure of the embodiment presented supra considers a side contact design it will be apparent to those skilled in the art that the advantages of the first order mode LC-SEG laser design will also apply to other laser structures which are grown on a doped substrate, and the lower contact is applied to the bottom of the substrate.

Figure 2:
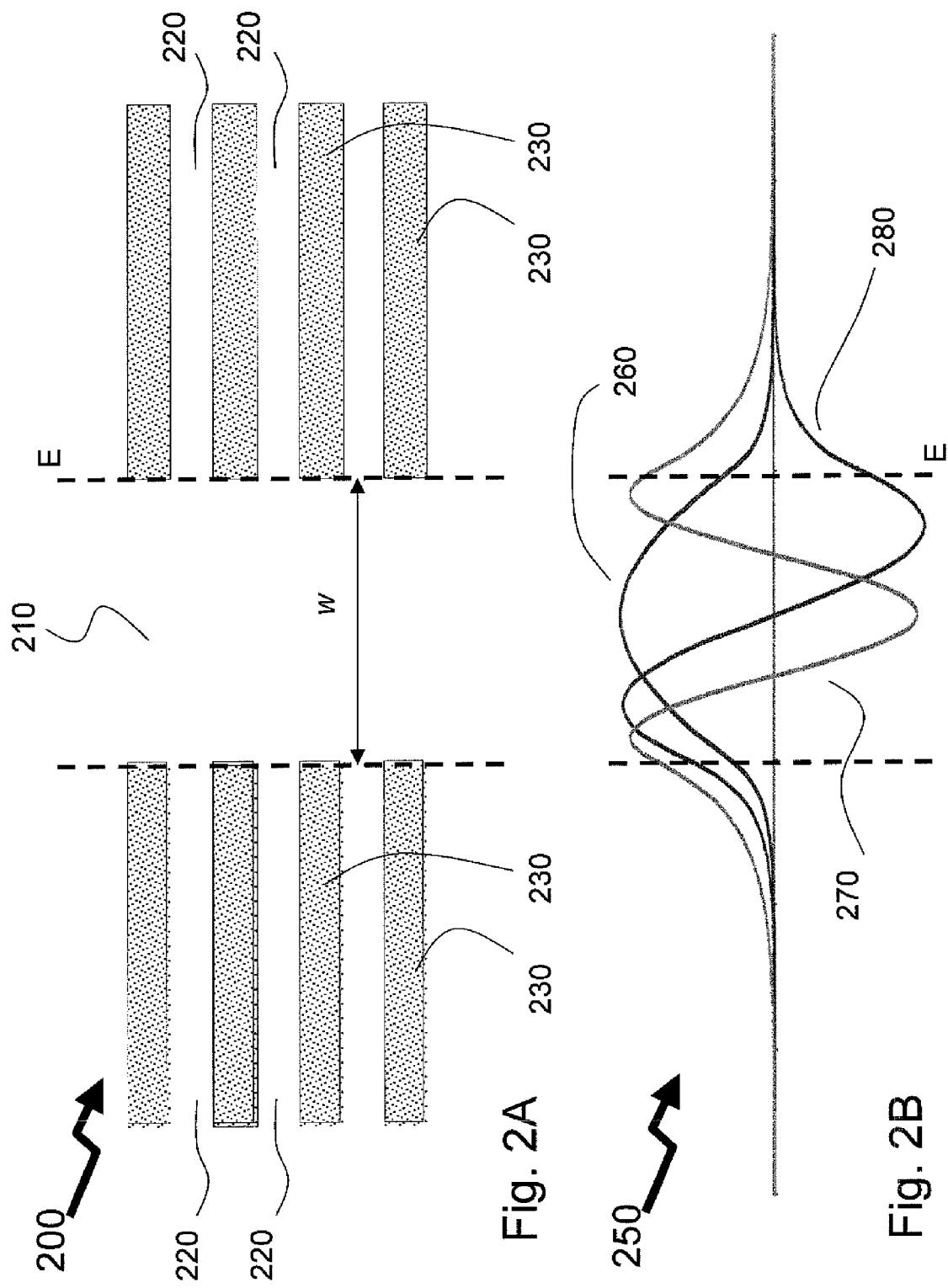
FIG. 2a presents a plan view of an LC-SEG DFB showing the location of the LC-SEG in relation to the central effective ridge.
FIG. 2b shows the positional relationship between the central effective ridge; LC SEG and the intensity distribution for the zero and first order mode. The diagram illustrates that larger lateral mode order results in increasing overlap with the grating region.
Figure 4:
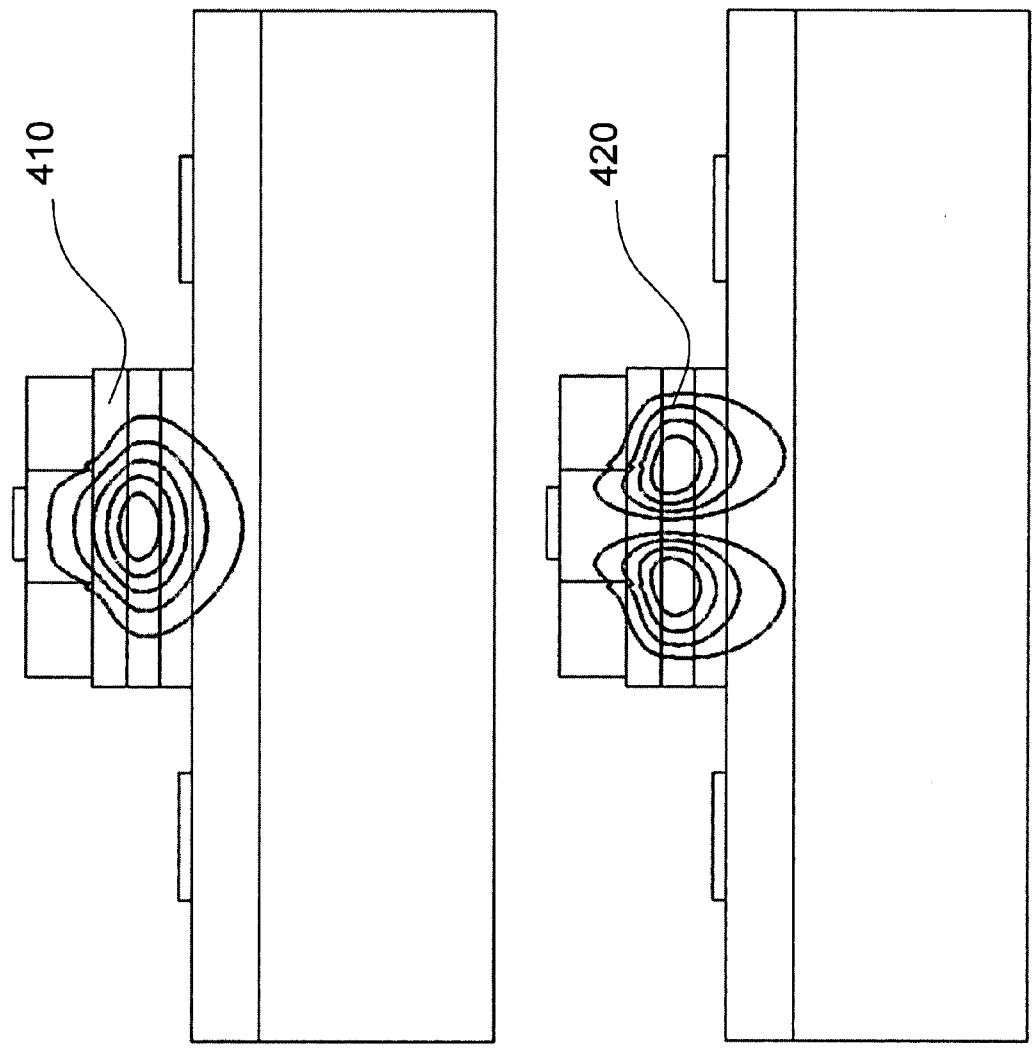
FIG. 4a presents the calculated intensity profile for the zero order mode, in relation to the structure defined in the first embodiment.
FIG. 4b presents the calculated intensity profile for the first order mode, in relation to the structure defined in the first embodiment.
Figure 5:
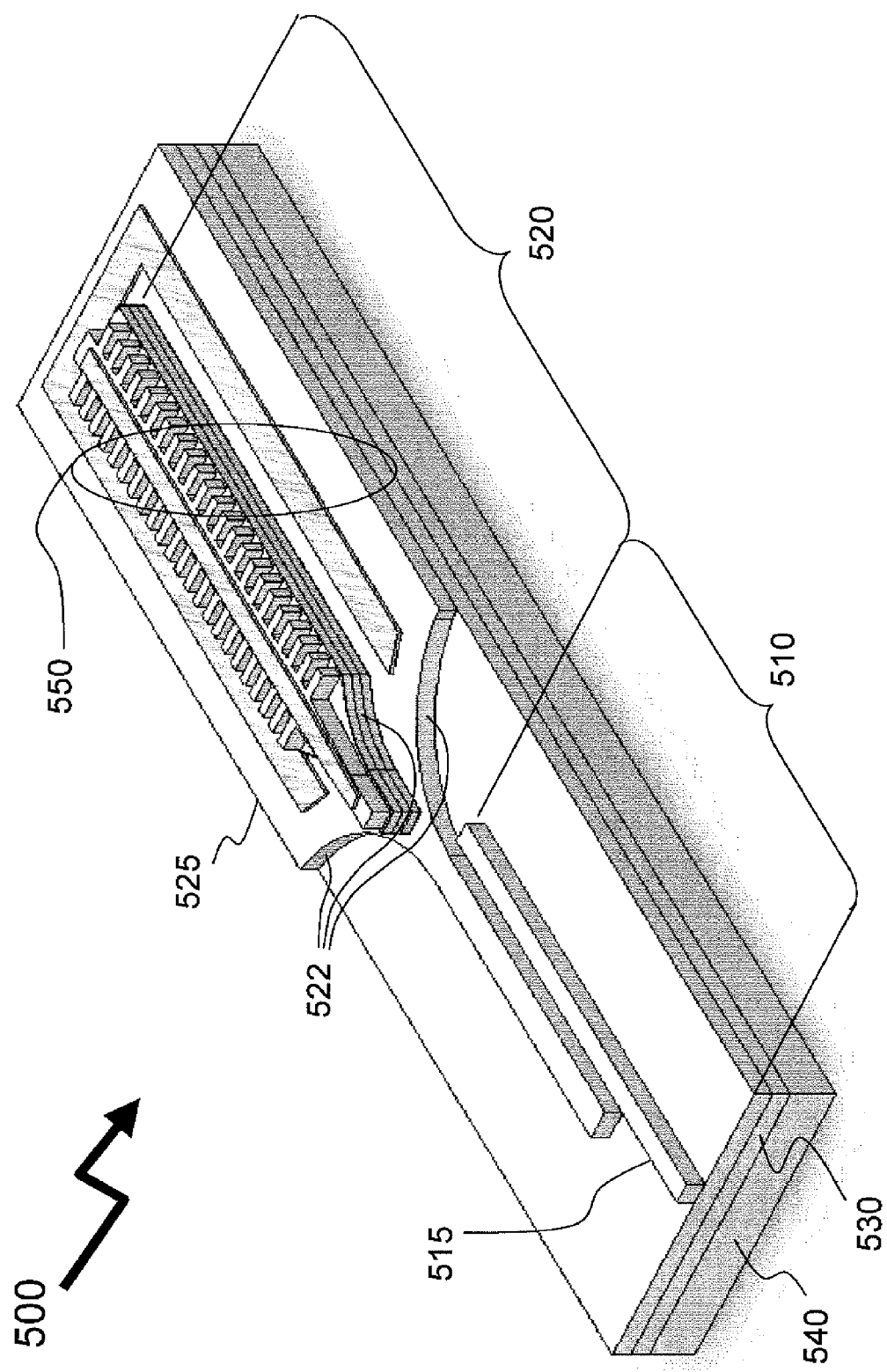
FIG. 5 presents schematic three-dimensional view of a LC-SEG DFB monolithically integrated with a first to zero mode converter according to the second embodiment.

In another embodiment of the invention as shown in fiber compatible laser 500, the laser described supra in respect of FIGS. 2 through 4 is combined with a first to zero order mode converter 510, in the form of an asymmetric lateral directional coupler, which transforms the first order lateral mode emitted by the laser 520 into a field profile with a symmetry that is compatible with conventional Corning® SMF28 singlemode optical fibre. In the embodiment of the fiber compatible laser 500 shown in FIG. 5, a passive semiconductor slab waveguide 530 is included between the substrate 540 and laser structure epitaxial structure 550 during growth. The thickness and composition of the passive waveguide 515 are chosen so that the laser emissions evanescently couple into the passive waveguide 515 when the mesa and the secondary mesa 525 are appropriately shaped, for example, with lateral tapers 522. The laser emissions, in the first order mode are then converted into a field having a zero order symmetry, which is compatible with Corning® SMF28 single mode optical fibre, by means of a photonic integrated circuit element such as an evanescent coupler. Alternatively the conversion of the first order mode to zero order mode could also be achieved with other passive integrated circuit elements other than the first to zero order mode converter 510. Optionally, in some PIC circuit designs the first to zero order mode converter 510 is implemented using conventional bulk/fibre optic components which are external to the discrete laser die or PIC and form part of the overall optical interfacing and packaging of the laser based component.

Figure 6:
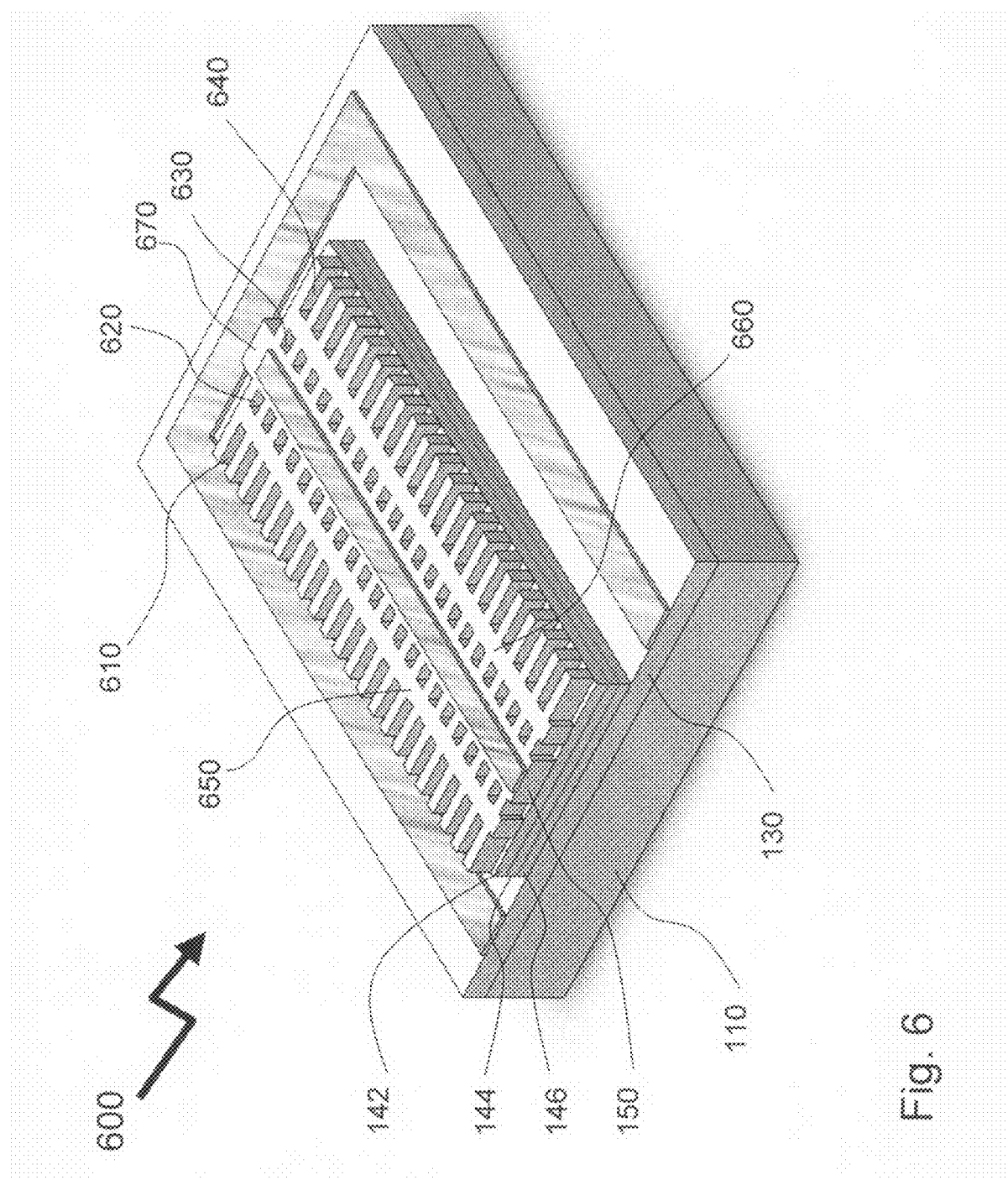
FIG. 6 presents a schematic three-dimensional view of an enhanced coupling LC-DFB according to the multiple effective ridge design.

FIG. 6 is a schematic three-dimensional of another embodiment of an enhanced coupling efficiency side-contact LC-DFB 600 according an multiple effective ridge design of the second embodiment. The laser layer structure of the enhanced coupling efficiency side-contact LC-DFB 600 is similar to that of FIG. 1 and comprises: a semi-insulating substrate 110; a lower contact layer 130; a lower SCH layer 146; an active layer 144, upper SCH layer 142; and an upper contact layer 150. The LC-SEG is located on top of the mesa region which is defined by etching from the top surface into the lower contact layer. The LC-SEG waveguide structure is defined by a periodic sequence of four parallel segmented trenches 610 through 650 which are formed by etching from the top surface of the structure into the upper SCH layer such that the intact material formed between the trenches forms a two side ridges 650, 660 in addition to a central effective ridge 670. The combination of the mesa; effective ridge; and LC-SEG provide lateral confinement for the slab waveguide which is formed by laser layer structure. The role of the side ridges 650, 660 in multiple effective ridge design is to dilute lateral confinement of waveguide from the central effective ridge 670 by increasing the grating index, over that which could be obtained from design employing a single effective ridge, as in embodiment one. The partitioning of the single effective ridge, formed by a continuous surface etched grating (SEG) on either side of the strip of intact material in the upper contact layer 150, into a plurality of effective ridges, as formed by the segmented SEG between the strips of intact material, results in a dilution of the confinement for the lateral mode and as a result increases the overlap between the LC grating and the optical mode, leading to an enhanced coupling coefficient. Such dilution being taught by V. Tolstikhin et al in "Integrated Vertical Wavelength (De)Multiplexer" [U.S. patent application Ser. No. 11/882,126].

Figure 7:
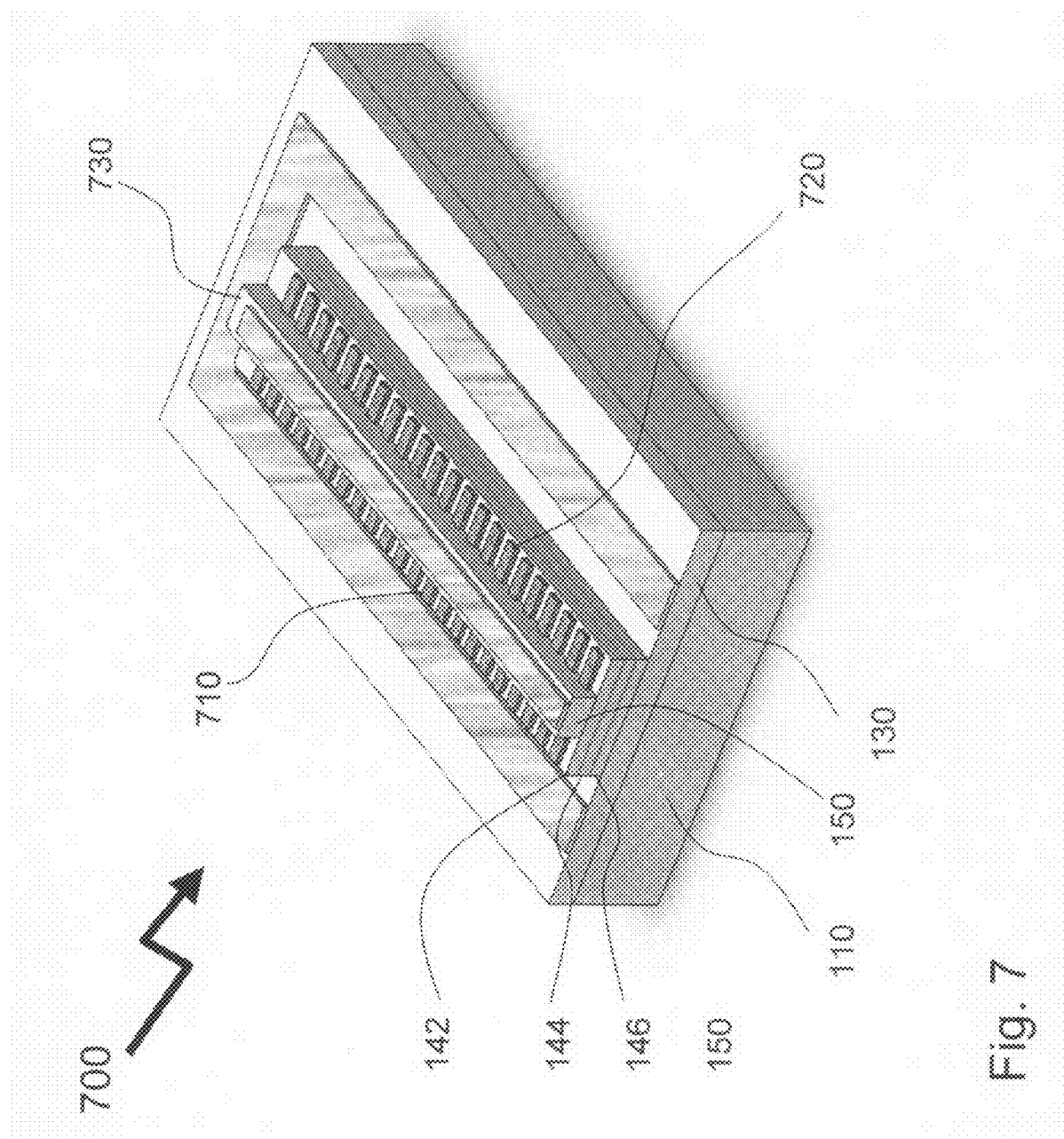
FIG. 7 presents a schematic three-dimensional view of an enhanced coupling LC-DFB according to the metal grating design.

Shown in FIG. 7 is a schematic three-dimensional of another embodiment of an enhanced coupling efficiency side-contact LC-DFB 700 according the metal grating design of the third embodiment. The laser layer structure of the enhanced coupling efficiency side-contact LC-DFB 700 is similar to that of FIG. 1 and comprises: a semi-insulating substrate 110; a lower contact layer 130; a lower SCH layer 146; an active layer 144; an upper SCH layer 142; and an upper contact layer 150. In this a periodic sequence of identical metal strips 710, 720 which are selectively deposited, by direct writing e-beam or optical stepper lithography, on either side of a central effective ridge 730 on the etched surface between the base of the central effective ridge and the edge of the mesa. The combination of the mesa; central effective ridge 730; and metal grating formed from the identical metal strips 710, 720 is provide lateral confinement for the slab waveguide which is formed by the laser layer structure of the enhanced coupling efficiency side-contact LC-DFB 700. The reduced lateral confinement of the first mode ensures greater over-lap with the metal grating region than could be achieved by using the zero order mode. Also, because of the reduced lateral confinement of the first order mode the metal strips can be sited more remotely from the central ridge, thereby facilitating improved fabrication.

Numerous other embodiments may be envisaged without departing from the spirit or scope of the invention.

What is claimed is:

1. An optical component comprising:
 a photonic integrated circuit comprising a plurality of processed semiconductor layers that were grown in a single growth step, the photonic integrated circuit comprising at least an optical emitter operating with distributed optical feedback provided from a surface grating formed within the plurality of processed semiconductor layers and generating an optical signal in a guided laterally asymmetric optical mode.

2. An optical component according to claim 1 further comprising:
 a mode converter for receiving the optical signal generated by the optical emitter in and converting the guided laterally asymmetric optical waveguide mode to a single fundamental lateral mode.

3. An optical component according to claim 1 wherein,
 providing the distributed optical feedback comprises providing feedback by at least one of a distributed feedback and distributed Bragg reflection.

4. An optical component according to claim 1 wherein,
 the optical emitter generating the optical signal in the laterally asymmetric optical mode comprises the optical emitter generating an optical signal in a first higher-order lateral mode.

5. An optical component according to claim 2 wherein,
 converting the laterally asymmetric optical mode to the single fundamental lateral mode comprises providing the single fundamental lateral mode of an optical waveguide, the optical waveguide is at least one of optically coupled to the mode converter, forming a predetermined portion of the mode converter, and coupled to the mode converter for receiving the single fundamental lateral mode.

6. An optical component according to claim 1 wherein, providing the surface grating comprises providing at least one of a central ridge, a first periodic sequence of parallel segmented trenches formed on one side of the central ridge and defined by a first predetermined location series; and a second periodic sequence of parallel segmented trenches formed on the other side of the central ridge and defined by a second predetermined location series.

7. A method comprising:
providing a laser comprising an optical emitter and a surface etched waveguide Bragg grating for providing distributed feedback required for lasing; and
operating the laser in a laterally asymmetric first-order mode having a substantial overlap with the surface etched waveguide Bragg grating.

8. A method according to claim 7 comprising:
providing an injection current having a density distribution, via side contacts to a mesa of the laser, for providing a substantial overlap between the density distribution and an optical field within an active layer of the laser.

9. A method according to claim 7 comprising:
transforming a laterally asymmetric first-order mode into a laterally symmetric optical mode.

10. A method according to claim 9 wherein transforming is performed using a mode converter.

11. A method according to claim 10 wherein the laser comprises a passive waveguide and an active waveguide having a similar mode profile to the passive waveguide and wherein the laser is for generating a laterally symmetric optical mode and comprising:
transitioning the laterally asymmetric optical mode from the active waveguide to the laterally symmetric mode at the passive waveguide via at least a lateral taper formed by semiconductor etching.

12. An optical component made from a plurality of processed semiconductor layers grown in one epitaxial growth step, implementable in at least one of indium phosphide (InP) based and gallium arsenide (GaAs) based III-V semiconductor material systems, comprising:
a semiconductor substrate, for supporting epitaxial growth of semiconductor layers having known optical properties defined by a bandgap wavelength of said semiconductor layers;
at least one passive optical waveguide, formed from the epitaxial semiconductor layers, and having bandgap wavelengths shorter than an operating wavelength, vertical and lateral optical confinement in the at least one passive optical waveguide achieved in dependence upon semiconductor layer material choices and processing;
at least one active optical waveguide defining an active layer having an upper cladding layer and a lower cladding layer, formed from a layered P-I-N structure with at least one epitaxial semiconductor layer of the active layer thereof within the I-region of the layered P-I-N structure, and having a bandgap wavelength close to an operating wavelength, vertical optical confinement in the at least one active optical waveguide being achieved in dependence upon semiconductor material choices for the upper and lower cladding layers;
a laterally-coupled distributed feedback waveguide structure formed in the upper cladding layer of the at least one active optical waveguide, and having two sets of periodic parallel trenches etched from the top surface of the optical component and separated by a stripe of intact material, the trenches for forming an effective ridge waveguide that provides a lateral optical confinement to guided modes generated by the optical component while, simultaneously, providing a distributed feedback to the guided modes through evanescent field coupling to the surface etched trenches acting as a waveguide Bragg grating, the effective ridge waveguide supporting at least one laterally asymmetric higher order optical mode having higher overlap with the laterally-coupled surface etched grating than a laterally symmetric fundamental optical mode;
an upper contact formed on the top surface of the effective ridge waveguide, between the two sets of trenches, and a mesa formed by etching the P-I-N layered structure, by etching the laterally-coupled distributed feedback waveguide, and etching down to a lower contact layer of the P-I-N structure to form side contacts, the upper contact and the side contacts for providing bias to the P-I-N structure of the active waveguide;
an asymmetric lateral directional coupler formed with the passive waveguide layers, the asymmetric lateral directional coupler having one arm supporting the at least one laterally asymmetric higher order optical mode and adiabatically coupled to the optical component and another arm supporting only the laterally symmetric fundamental optical mode and adiabatically coupled to an optical port; and,
lateral tapers defined in transition regions between the active and passive waveguides, the lateral tapers formed by etching a semiconductor layer within the active and passive waveguide levels and at the mesa structure level for ensuring smooth adiabatic transition of the guided modes between the active and passive waveguides.

13. An optical component according to claim 12 wherein the active optical waveguide comprises a laterally-coupled distributed feedback laser.

14. An optical component according to claim 13 wherein in use the laterally-coupled distributed feedback laser provides a single-mode generation by operating in a laterally asymmetric first-order optical mode having more efficient evanescent field coupling to the surface etched waveguide Bragg grating than a laterally symmetric zero-order optical mode.

15. An optical component according to claim 14 comprising:
a bias control for in use injecting from side contacts into the mesa and active layer an injection current with a density having a double-peaked lateral distribution overlapping with the optical field distribution in a laterally asymmetric first-order optical mode.

16. An optical component according to claim 15 wherein in use
the laterally asymmetric first-order optical mode generated in the effective ridge laterally-coupled distributed feedback laser is coupled into a vertically integrated passive waveguide supporting at least two lateral optical modes, symmetric zero-order and asymmetric first-order lateral optical modes, wherein the lateral tapering is within both the active and passive waveguide levels.

17. An optical component according to claim 16 comprising:
an asymmetric lateral directional coupler formed with the passive waveguide level for transforming the laterally asymmetric first-order mode into the laterally symmetric zero-order mode prior to coupling the mode via an optical port.

* * * * *